United States Patent
Chen et al.

(10) Patent No.: US 7,671,657 B1
(45) Date of Patent: Mar. 2, 2010

(54) VOLTAGE LEVEL SHIFTER WITH VOLTAGE BOOST MECHANISM

(75) Inventors: Chih-Chia Chen, Taipei (TW); Chien-Chuan Chung, Taipei (TW)

(73) Assignee: Advanced Analog Technology, Inc., Hsinchu (TW)

(*) Notice: Subject to any disclaimer, the term of this patent is extended or adjusted under 35 U.S.C. 154(b) by 0 days.

(21) Appl. No.: 12/252,369

(22) Filed: Oct. 16, 2008

(30) Foreign Application Priority Data

Sep. 5, 2008 (TW) .............................. 97134057 A

(51) Int. Cl.
*H03L 5/00* (2006.01)
(52) U.S. Cl. .......................... 327/333; 326/68; 326/80; 365/189.11
(58) Field of Classification Search ................. 327/333; 326/80, 81, 68; 365/189.11
See application file for complete search history.

(56) References Cited

U.S. PATENT DOCUMENTS

2006/0087358 A1*  4/2006  Heaston ...................... 327/333

* cited by examiner

*Primary Examiner*—Long Nguyen
*Assistant Examiner*—Shikha Goyal
(74) *Attorney, Agent, or Firm*—Winston Hsu

(57) ABSTRACT

A voltage level shifter with voltage boost mechanism is disclosed for interfacing two circuit units having different operating voltage swings. The voltage level shifter includes a first inverter, a second inverter, a first capacitor, a second capacitor and a plurality of transistors. The input and power ends of the first inverter function to receive an input voltage and a first voltage respectively. The output end of the second inverter functions to provide an output voltage. When the input voltage is a ground voltage, the output voltage is also a ground voltage; meanwhile, the switches are controlled for charging the first and second capacitors to a second voltage and a third voltage respectively. When the input voltage is the first voltage, a sum voltage of the first, second, and third voltages is furnished to the power end of the second inverter for providing the sum voltage as the output voltage.

5 Claims, 5 Drawing Sheets

US 7,671,657 B1

VOLTAGE LEVEL SHIFTER WITH VOLTAGE BOOST MECHANISM

BACKGROUND OF THE INVENTION

1. Field of the Invention

The present invention relates to a voltage level shifter, and more particularly, to a voltage level shifter with voltage boost mechanism for providing an interface between two circuit units having different operating voltage swings.

2. Description of the Prior Art

Historically, the primary mode of reducing power consumption in electronic circuits has been to insistently scale down the power supply voltage. Recently, a move to 1.8 V power supply has been popularized among low-power and high-speed circuit designers. However, problems may arise when a low-voltage integrated circuit is coupled to a high-voltage integrated circuit, or when the output signal of an integrated circuit having a low operating voltage swing is utilized for driving another integrated circuit having a high operating voltage swing. That is, when a front-end integrated circuit having a low operating voltage swing is coupled to a back-end integrated circuit having a high operating voltage swing, the operating voltage swing of the output signal generated by the front-end integrated circuit is required to be converted from the low operating voltage swing to the high operating voltage swing by making use of a voltage conversion interface.

Please refer to FIG. 1, which is a circuit diagram schematically showing a prior-art voltage level shifter with voltage boost mechanism. As shown in FIG. 1, the voltage level shifter 100 comprises a first transistor 111, a second transistor 112, a third transistor 121, a fourth transistor 122, and an inverter 131. The supply voltage for use in the inverter 131 is a first voltage Vdd1. A second voltage Vdd2 is furnished to both the sources of the first transistor 111 and the third transistor 121. The first voltage Vdd1 is also furnished to the gate of the fourth transistor 122. The second voltage Vdd2 is greater than the first voltage Vdd1. When the input voltage Vin of the inverter 131 is a ground voltage, the internal voltage Vint is the first voltage Vdd1. Alternatively, when the input voltage Vin of the inverter 131 is the first voltage Vdd1, the internal voltage Vint is the ground voltage. The first transistor 111 through the fourth transistor 122 are coupled to form an inverting circuit. When the internal voltage Vint is the ground voltage, the output voltage Vout generated by the inverting circuit is the second voltage Vdd2. On the contrary, when the internal voltage Vint is the first voltage Vdd1, the output voltage Vout generated by the inverting circuit is the ground voltage. That is, the first operating voltage swing regarding the input voltage Vin falls into a range between the first voltage Vdd1 and the ground voltage, and the second operating voltage swing regarding the output voltage Vout falls into a range between the second voltage Vdd2 and the ground voltage.

Accordingly, the voltage level shifter 100 functions to perform a voltage level shifting operation on the input voltage Vin having the first operating voltage swing for generating the output voltage Vout having the second operating voltage swing. However, both the first voltage Vdd1 and the second voltage Vdd2 are required in the circuit operation of the voltage level shifter 100. For that reason, a voltage generator is normally installed for providing dual supply voltages to the voltage level shifter 100, and therefore the voltage level shifter 100 is hard to be put into applications. In other words, when the voltage level shifter 100 is used for interfacing two circuit units having different operating voltage swings, the voltage level shifter 100 is unable to perform the voltage level shifting operation based on only a single supply voltage of either circuit unit.

SUMMARY OF THE INVENTION

In accordance with an embodiment of the present invention, a voltage level shifter with voltage boost mechanism is provided for interfacing two circuit units having different operating voltage swings. The voltage level shifter comprises a first inverter, a second inverter, a first transistor, a second transistor, a third transistor, a fourth transistor, a fifth transistor, a sixth transistor, a first capacitor, and a second capacitor.

The first inverter comprises an input end for receiving an input voltage, an output end, and a power end for receiving a supply voltage. The second inverter comprises an input end coupled to the output end of the first inverter, an output end for outputting an output voltage, and a power end. The first transistor comprises a source for receiving the supply voltage, a drain coupled to the power end of the second inverter, and a gate. The second transistor comprises a source coupled to the drain of the first transistor, a drain coupled to the gate of the first transistor, and a gate coupled to the output end of the first inverter. The third transistor comprises a source coupled to the drain of the first transistor, a drain, and a gate coupled to the drain of the second transistor. The fourth transistor comprises a source coupled to the drain of the third transistor, a drain, and a gate coupled to the output end of the first inverter. The fifth transistor comprises a drain coupled to the gate of the first transistor, a gate coupled to the output end of the first inverter, and a source coupled to the input end of the first inverter. The sixth transistor comprises a drain coupled to the input end of the first inverter, a gate coupled to the output end of the first inverter, and a source coupled to the drain of the fourth transistor. The first capacitor comprises a first end coupled to the source of the fifth transistor and a second end coupled to the drain of the third transistor. The second capacitor comprises a first end coupled to the drain of the fourth transistor and a second end coupled to the drain of the first transistor.

The present invention further provides a voltage level shifter with voltage boost mechanism for interfacing two circuit units having different operating voltage swings. The voltage level shifter comprises a first inverter, a second inverter, a first transistor, a second transistor, a third transistor, a fourth transistor, a fifth transistor, a sixth transistor, a first capacitor, and a switch.

The first inverter comprises an input end for receiving an input voltage, an output end, and a power end for receiving a supply voltage. The second inverter comprises an input end coupled to the output end of the first inverter, an output end for outputting an output voltage, and a power end. The first transistor comprises a source for receiving the supply voltage, a drain coupled to the power end of the second inverter, and a gate. The second transistor comprises a source coupled to the drain of the first transistor, a drain coupled to the gate of the first transistor, and a gate coupled to the output end of the first inverter. The third transistor comprises a source coupled to the drain of the first transistor, a drain, and a gate coupled to the drain of the second transistor. The fourth transistor comprises a source coupled to the drain of the third transistor, a drain, and a gate coupled to the output end of the first inverter. The fifth transistor comprises a drain coupled to the gate of the first transistor, a gate coupled to the output end of the first inverter, and a source coupled to the input end of the first inverter. The sixth transistor comprises a drain coupled to the input end of the first inverter, a gate coupled to the output end of the first inverter, and a source coupled to the drain of the fourth transistor. The first capacitor comprises a first end coupled to the source of the fifth transistor and a second end coupled to the drain of the third transistor. The switch comprises a first end coupled to the drain of the fourth transistor, a second end coupled to the drain of the first transistor, and a control end for receiving the input voltage.

Furthermore, the present invention provides a voltage level shifter with voltage boost mechanism for interfacing two circuit units having different operating voltage swings. The voltage level shifter comprises a first inverter, a second inverter, a first transistor, a second transistor, a third transistor, a fourth transistor, a fifth transistor, a sixth transistor, a first capacitor, and a switch.

The first inverter comprises an input end for receiving an input voltage, an output end, and a power end for receiving a supply voltage. The second inverter comprises an input end coupled to the output end of the first inverter, an output end for outputting an output voltage, and a power end. The first transistor comprises a source for receiving the supply voltage, a drain coupled to the power end of the second inverter, and a gate. The second transistor comprises a source coupled to the drain of the first transistor, a drain coupled to the gate of the first transistor, and a gate coupled to the output end of the first inverter. The third transistor comprises a source coupled to the drain of the first transistor, a drain, and a gate coupled to the drain of the second transistor. The fourth transistor comprises a source coupled to the drain of the third transistor, a drain, and a gate coupled to the output end of the first inverter. The fifth transistor comprises a drain coupled to the gate of the first transistor, a gate coupled to the output end of the first inverter, and a source coupled to the input end of the first inverter. The sixth transistor comprises a drain coupled to the input end of the first inverter, a gate coupled to the output end of the first inverter, and a source coupled to the drain of the fourth transistor. The first capacitor comprises a first end coupled to the drain of the fourth transistor and a second end coupled to the drain of the first transistor. The switch comprises a first end coupled to the source of the fifth transistor, a second end coupled to the drain of the third transistor, and a control end for receiving the input voltage.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
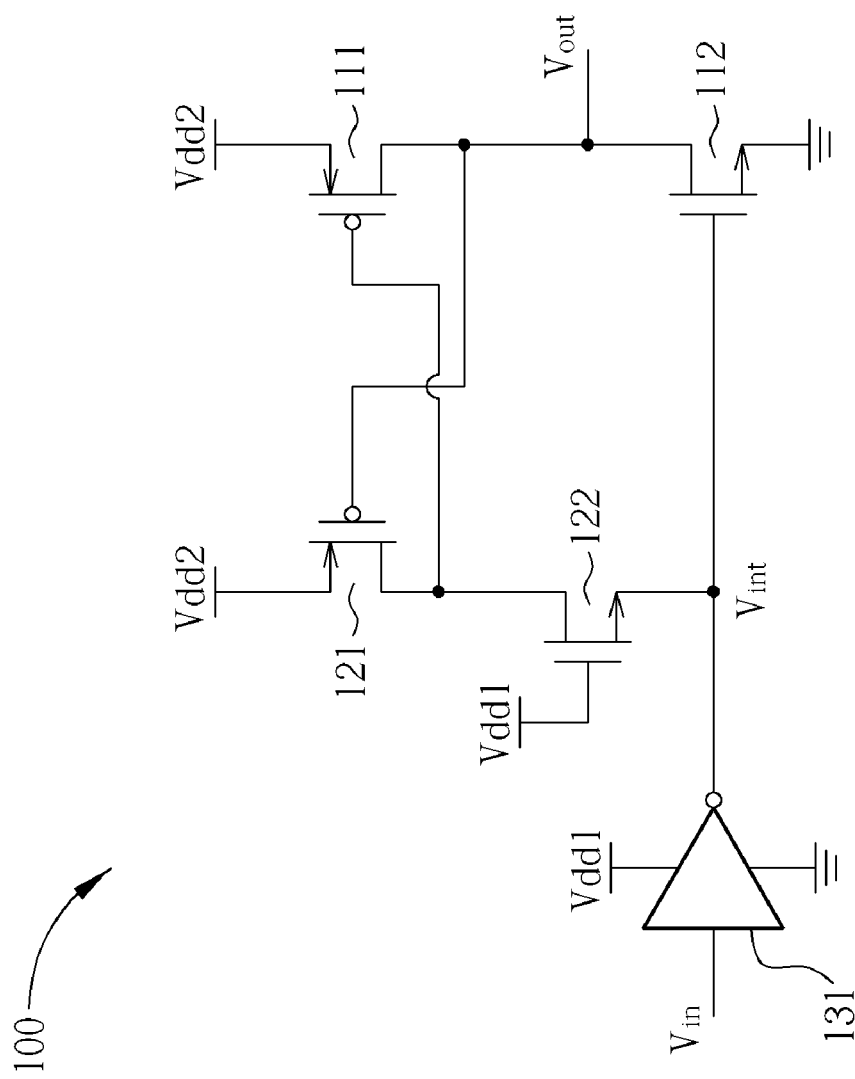
FIG. 1 is a circuit diagram schematically showing a prior-art voltage level shifter with voltage boost mechanism.
Figure 2:
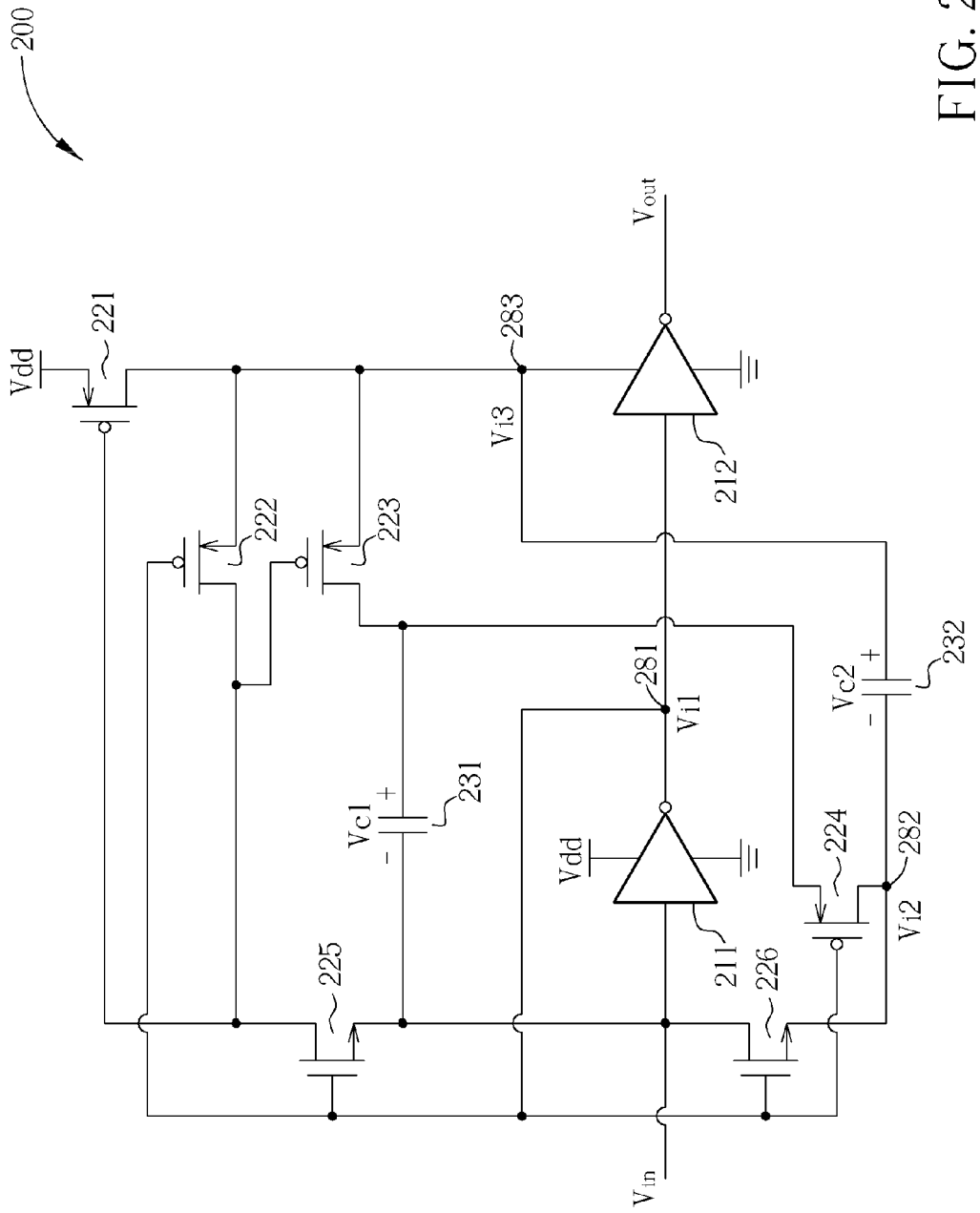
FIG. 2 is a circuit diagram schematically showing a voltage level shifter with voltage boost mechanism in accordance with a first embodiment of the present invention.

Please refer to FIG. 2, which is a circuit diagram schematically showing a voltage level shifter with voltage boost mechanism in accordance with a first embodiment of the present invention. As shown in FIG. 2, the voltage level shifter 200 comprises a first inverter 211, a second inverter 212, a first transistor 221, a second transistor 222, a third transistor 223, a fourth transistor 224, a fifth transistor 225, a sixth transistor 226, a first capacitor 231, and a second capacitor 232. The first transistor 221, the second transistor 222, the third transistor 223 and the fourth transistor 224 are P-type metal oxide semiconductor (MOS) field effect transistors or P-type junction field effect transistors. The fifth transistor 225 and the sixth transistor 226 are N-type MOS field effect transistors or N-type junction field effect transistors.

The first inverter 211 comprises an input end for receiving an input voltage Vin, a power end for receiving a voltage Vdd, and an output end. The second inverter 212 comprises an input end coupled to the output end of the first inverter 211, an output end for outputting an output voltage Vout generated, and a power end. The first transistor 221 comprises a source for receiving the voltage Vdd, a drain coupled to the power end of the second inverter 212, and a gate. The second transistor 222 comprises a source coupled to the drain of the first transistor 221, a drain coupled to the gate of the first transistor 221, and a gate coupled to the output end of the first inverter 211. The third transistor 223 comprises a source coupled to the drain of the first transistor 221, a gate coupled to the drain of the second transistor 222, and a drain. The fourth transistor 224 comprises a source coupled to the drain of the third transistor 223, a gate coupled to the output end of the first inverter 211, and a drain.

The fifth transistor 225 comprises a drain coupled to the gate of the first transistor 221, a gate coupled to the output end of the first inverter 211, and a source coupled to the input end of the first inverter 211. The sixth transistor 226 comprises a drain coupled to the input end of the first inverter 211, a gate coupled to the output end of the first inverter 211, and a source coupled to the drain of the fourth transistor 224. The first capacitor 231 is coupled between the source of the fifth transistor 225 and the drain of the third transistor 223. The second capacitor 232 is coupled between the drain of the fourth transistor 224 and the drain of the first transistor 221.

The first inverter 211 performs an inverting operation on the input voltage Vin for generating an internal voltage Vi1 at a first node 281. Consequently, the internal voltage Vi1 is opposite to the input voltage Vin. The internal voltage Vi1 is forwarded to the gate of the second transistor 222, the gate of the fourth transistor 224, the gate of the fifth transistor 225, the gate of the sixth transistor 226, and the input end of the second inverter 212. The circuit operation of the voltage level shifter 200 is detailed as the followings.

When the input voltage Vin is the ground voltage, the internal voltage Vi1 outputted from the first inverter 211 is the voltage Vdd. Then, the voltage Vdd is forwarded to the gate of the second transistor 222, the gate of the fourth transistor 224, the gate of the fifth transistor 225, the gate of the sixth transistor 226, and the input end of the second inverter 212. Therefore, the fifth transistor 225 and the sixth transistor 226 are turned on, and the second transistor 222 and the fourth transistor 224 are turned off. When the sixth transistor 226 is turned on, the ground voltage is forwarded to a second node 282, and an internal voltage Vi2 at the second node 282 becomes the ground voltage. When the fifth transistor 225 is turned on, the ground voltage is forwarded to the gates of the first transistor 221 and the third transistor 223, and the first transistor 221 and the third transistor 223 are then turned on. Meanwhile, the first capacitor 231 is charged by the voltage Vdd via the first transistor 221 and the third transistor 223 so that the first capacitor voltage Vc1 can be boosted to the voltage Vdd. Furthermore, the second capacitor 232 is charged by the voltage Vdd via the first transistor 221 so that the second capacitor voltage Vc2 can be also boosted to the voltage Vdd. Besides, the voltage Vdd is furnished to the power end of the second inverter 212 via the first transistor 221 so that the second inverter 212 is able to perform an inverting operation on the internal voltage Vi1 for outputting the ground voltage as the output voltage Vout.

When the input voltage Vin is the voltage Vdd, the internal voltage Vi1 outputted from the first inverter 211 is the ground voltage. Then, the ground voltage is forwarded to the gate of the second transistor 222, the gate of the fourth transistor 224, the gate of the fifth transistor 225, the gate of the sixth transistor 226, and the input end of the second inverter 212. Therefore, the fifth transistor 225 and the sixth transistor 226 are turned off, and the second transistor 222 and the fourth transistor 224 are turned on. Then, an internal voltage Vi3 at a third node 283 turns out to be a sum voltage of the input voltage Vin, the first capacitor voltage Vc1 and the second capacitor voltage Vc2. That is, the internal voltage Vi3 is substantially equal to 3Vdd. The internal voltage Vi3 can be forwarded to the gates of the first transistor 221 and the third transistor 223, and the first transistor 221 and the third transistor 223 are then turned off. The internal voltage Vi3 is also employed to power the second inverter 212 so that the second inverter 212 is able to perform an inverting operation on the internal voltage Vi1 for outputting the sum voltage 3Vdd as the output voltage Vout.

In view of that, the voltage level shifter 200 requires only one single voltage Vdd for performing the level shifting operation on the input voltage Vin. Accordingly, when the voltage level shifter 200 is put in use for interfacing two circuit units having different operating voltage swings, the voltage level shifter 200 is able to perform the voltage level shifting operation based on only the low supply voltage of a front-end circuit unit for generating an output voltage Vout having a high operating voltage swing for driving a back-end circuit unit. In other words, the voltage level shifter 200 is able to work without the aid of a dual voltage generator, and therefore the voltage level shifter 200 can be put into applications effortlessly.

Figure 3:
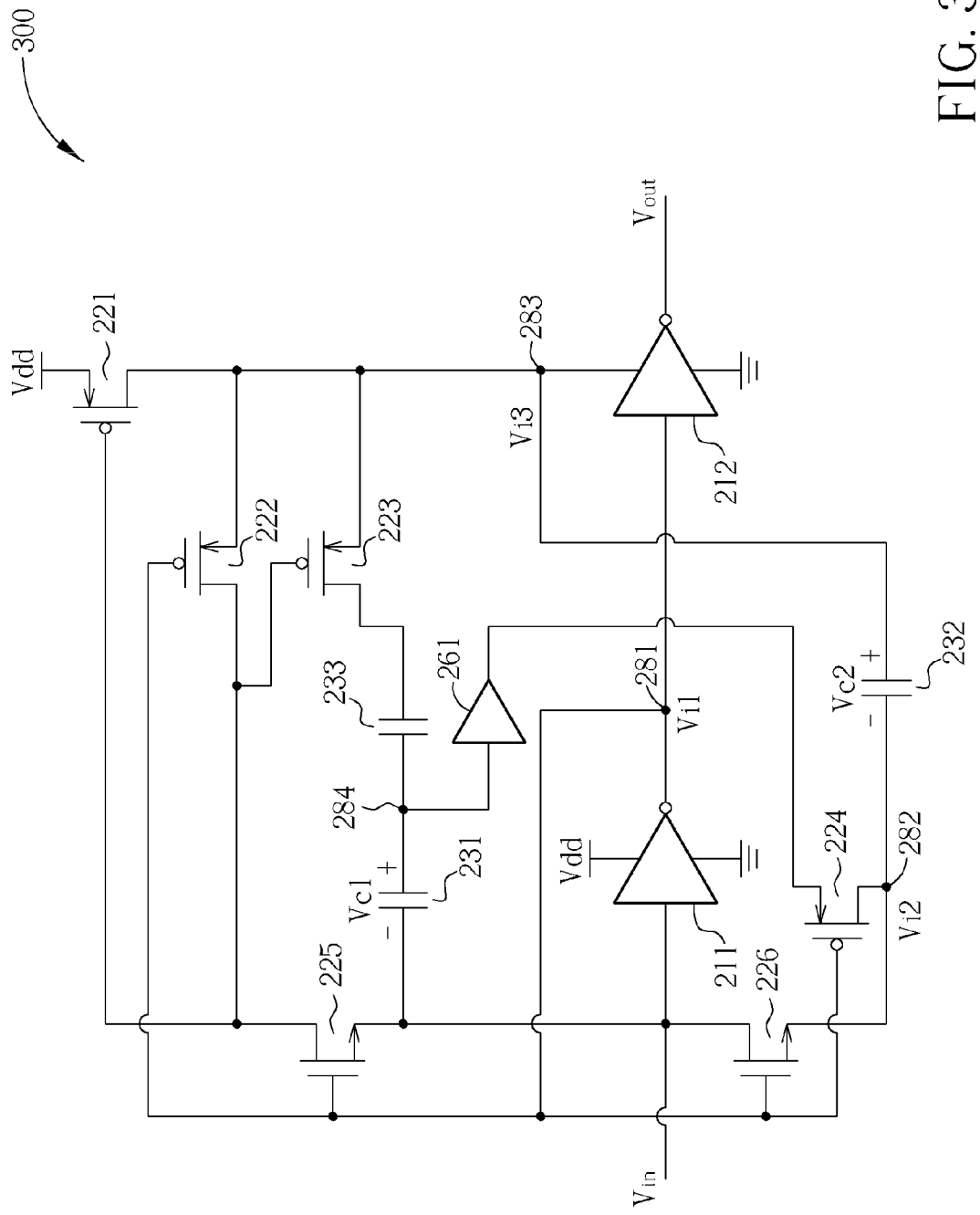
FIG. 3 is a circuit diagram schematically showing a voltage level shifter with voltage boost mechanism in accordance with a second embodiment of the present invention.

Please refer to FIG. 3, which is a circuit diagram schematically showing a voltage level shifter with voltage boost mechanism in accordance with a second embodiment of the present invention. As shown in FIG. 3, the voltage level shifter 300 comprises a first inverter 211, a second inverter 212, a first transistor 221, a second transistor 222, a third transistor 223, a fourth transistor 224, a fifth transistor 225, a sixth transistor 226, a first capacitor 231, a second capacitor 232, a third capacitor 233, and a buffer 261. The third capacitor 233 is coupled between the first capacitor 231 and the drain of the third transistor 223. The buffer 261 comprises an input end and an output end. The input end of the buffer 261 is coupled to a fourth node 284, which is the connection node between the first capacitor 231 and the third capacitor 233. The output end of the buffer 261 is coupled to the source of the fourth transistor 224. The buffer 261 functions to forward the node voltage at the fourth node 284 to the source of the fourth transistor 224 without having an effect on the charges stored in the first capacitor 231.

The structure of the voltage level shifter 300 is similar to the structure of the voltage level shifter 200, differing only in that the third capacitor 233 and the buffer 261 are added. The circuit operation of the voltage level shifter 300 is briefed as the followings.

When the input voltage Vin is the ground voltage, the first transistor 221, the third transistor 223, the fifth transistor 225 and the sixth transistor 226 are turned on, and the second transistor 222 and the fourth transistor 224 are turned off. The second capacitor 232 is then charged by the voltage Vdd via the first transistor 221 so that the second capacitor voltage Vc2 can be boosted to the voltage Vdd. Meanwhile, the first capacitor 231 and the third capacitor 233 are charged by the voltage Vdd via the first transistor 221 and the third transistor 223 so that the first capacitor voltage Vc1 can be boosted to a voltage Vx1 expressed as Formula (1) listed below.

$$Vx1 = \frac{C3}{C1+C3}Vdd \qquad \text{Formula (1)}$$

In Formula (1), C1 represents the capacitance of the first capacitor 231 and C3 represents the capacitance of the third capacitor 233. Besides, the voltage Vdd is furnished to the power end of the second inverter 212 via the first transistor 221 so that the second inverter 212 is able to perform an inverting operation on the internal voltage Vi1 for outputting the ground voltage as the output voltage Vout.

When the input voltage Vin is the voltage Vdd, the fifth transistor 225 and the sixth transistor 226 are turned off, and the second transistor 222 and the fourth transistor 224 are turned on. The internal voltage Vi3 at the third node 283 turns out to be a sum voltage Vx2 of the input voltage Vin, the first capacitor voltage Vc1 and the second capacitor voltage Vc2. The sum voltage Vx2 can be expressed as Formula (2) listed below.

$$Vx2 = 2Vdd + \frac{C3}{C1+C3}Vdd \qquad \text{Formula (2)}$$

The sum voltage Vx2 is forwarded to the gates of the first transistor 221 and the third transistor 223 via the second transistor 222, and the first transistor 221 and the third transistor 223 are then turned off. Furthermore, the sum voltage Vx2 is furnished to the power end of the second inverter 212 so that the second inverter 212 is able to perform an inverting operation on the internal voltage Vi1 for outputting the sum voltage Vx2 as the output voltage Vout.

In view of that, the voltage level shifter 300 requires still only one single voltage Vdd for performing the level shifting operation on the input voltage Vin. Besides, the high level of the output voltage Vout can be adjusted in a range between 2Vdd and 3Vdd according to the capacitances C1 and C3. Consequently, the voltage level shifter 300 can be put into applications flexibly and effortlessly.

Figure 4:
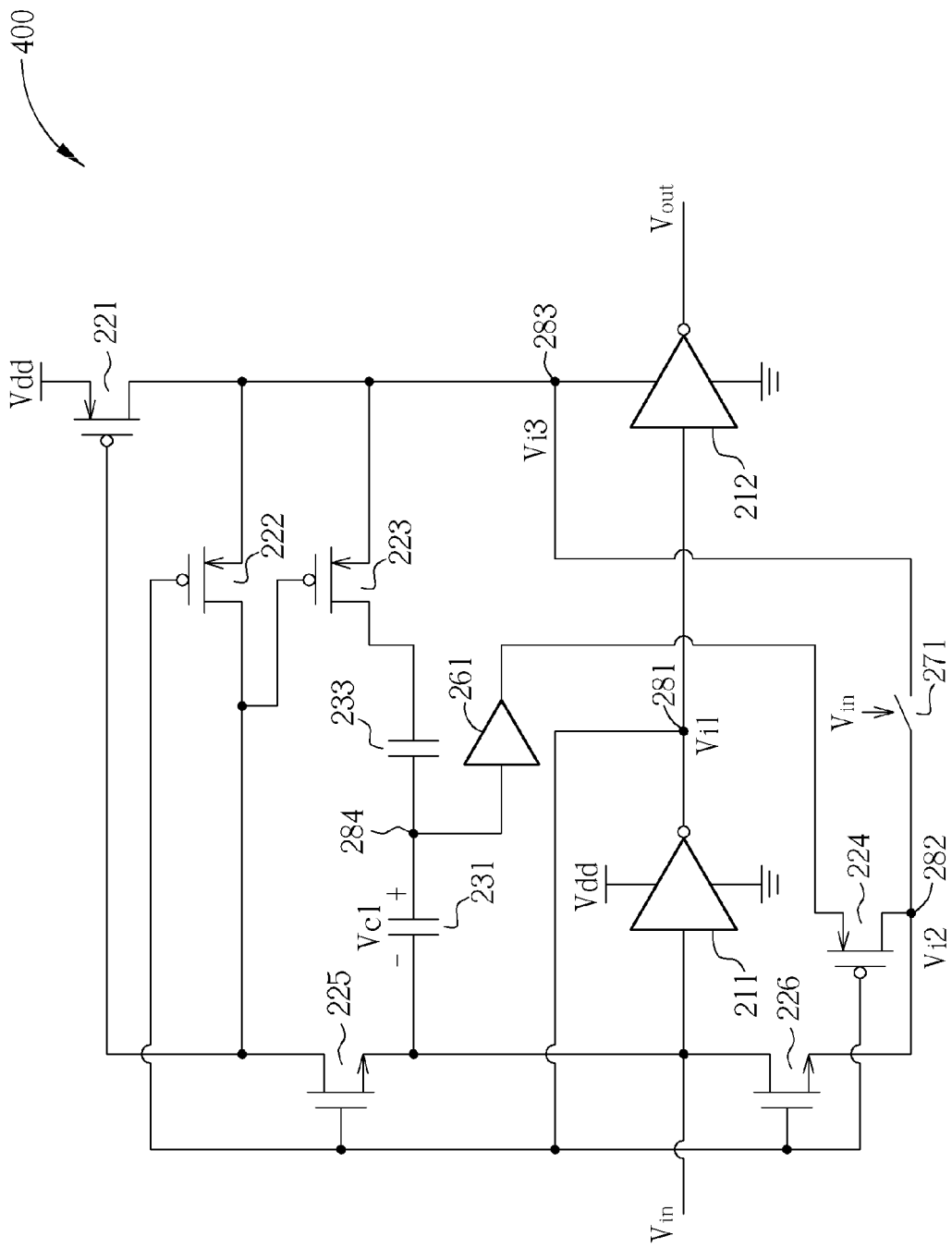
FIG. 4 is a circuit diagram schematically showing a voltage level shifter with voltage boost mechanism in accordance with a third embodiment of the present invention.

Please refer to FIG. 4, which is a circuit diagram schematically showing a voltage level shifter with voltage boost mechanism in accordance with a third embodiment of the present invention. As shown in FIG. 4, the voltage level shifter 400 comprises a first inverter 211, a second inverter 212, a first transistor 221, a second transistor 222, a third transistor 223, a fourth transistor 224, a fifth transistor 225, a sixth transistor 226, a first capacitor 231, a third capacitor 233, a switch 271, and a buffer 261. The switch 271 comprises a first end coupled to the drain of the fourth transistor 224, a second end coupled to the drain of the first transistor 221, and a control end for receiving the input voltage Vin. When the input voltage Vin is the ground voltage, the switch 271 is turned off; alternatively, when the input voltage Vin is the voltage Vdd, the switch 271 is turned on.

The structure of the voltage level shifter 400 is similar to the structure of the voltage level shifter 300, differing only in that the second capacitor 232 is replaced with the switch 271. The circuit operation of the voltage level shifter 400 is briefed as the followings.

When the input voltage Vin is the ground voltage, the first transistor 221, the third transistor 223, the fifth transistor 225 and the sixth transistor 226 are turned on, and the second transistor 222, the fourth transistor 224 and the switch 271 are turned off. The first capacitor 231 and the third capacitor 233 are charged by the voltage Vdd via the first transistor 221 and the third transistor 223 so that the first capacitor voltage Vc1 can be boosted to the voltage Vx1 expressed as Formula (1) listed above. Besides, the voltage Vdd is furnished to the power end of the second inverter 212 via the first transistor 221 so that the second inverter 212 is able to perform an inverting operation on the internal voltage Vi1 for outputting the ground voltage as the output voltage Vout.

When the input voltage Vin is the voltage Vdd, the fifth transistor 225 and the sixth transistor 226 are turned off, and the second transistor 222, the fourth transistor 224 and the switch 271 are turned on. The internal voltage Vi3 at the third node 283 turns out to be a sum voltage Vx3 of the input voltage Vin and the first capacitor voltage Vc1. The sum voltage Vx3 can be expressed as Formula (3) listed below.

$$Vx3 = Vdd + \frac{C3}{C1 + C3} Vdd \qquad \text{Formula (3)}$$

The sum voltage Vx3 is forwarded to the gates of the first transistor 221 and the third transistor 223 via the second transistor 222, and the first transistor 221 and the third transistor 223 are then turned off. Furthermore, the sum voltage Vx2 is furnished to the power end of the second inverter 212 so that the second inverter 212 is able to perform an inverting operation on the internal voltage Vi1 for outputting the sum voltage Vx3 as the output voltage Vout.

In view of that, the voltage level shifter 400 requires still only one single voltage Vdd for performing the level shifting operation on the input voltage Vin. Besides, the high level of the output voltage Vout can be adjusted in a range between Vdd and 2Vdd according to the capacitances C1 and C3. Consequently, the voltage level shifter 400 can be put into applications flexibly and effortlessly.

In another embodiment, the third capacitor 233 and the buffer 261 can be omitted in the voltage level shifter 400. That is, the first capacitor 231 is coupled directly between the source of the fifth transistor 225 and the drain of the third transistor 223, and the source of the fourth transistor 224 is coupled directly to the drain of the third transistor 223. Accordingly, when the input voltage Vin is the ground voltage, the first capacitor voltage Vc1 is boosted to the voltage Vdd. When the input voltage Vin is the voltage Vdd, the internal voltage Vi3 at the third node 283 becomes a sum voltage 2Vdd of the input voltage Vin and the first capacitor voltage Vc1; meanwhile, the second inverter 212 performs an inverting operation on the internal voltage Vi1 for outputting the sum voltage 2Vdd as the output voltage Vout.

Figure 5:
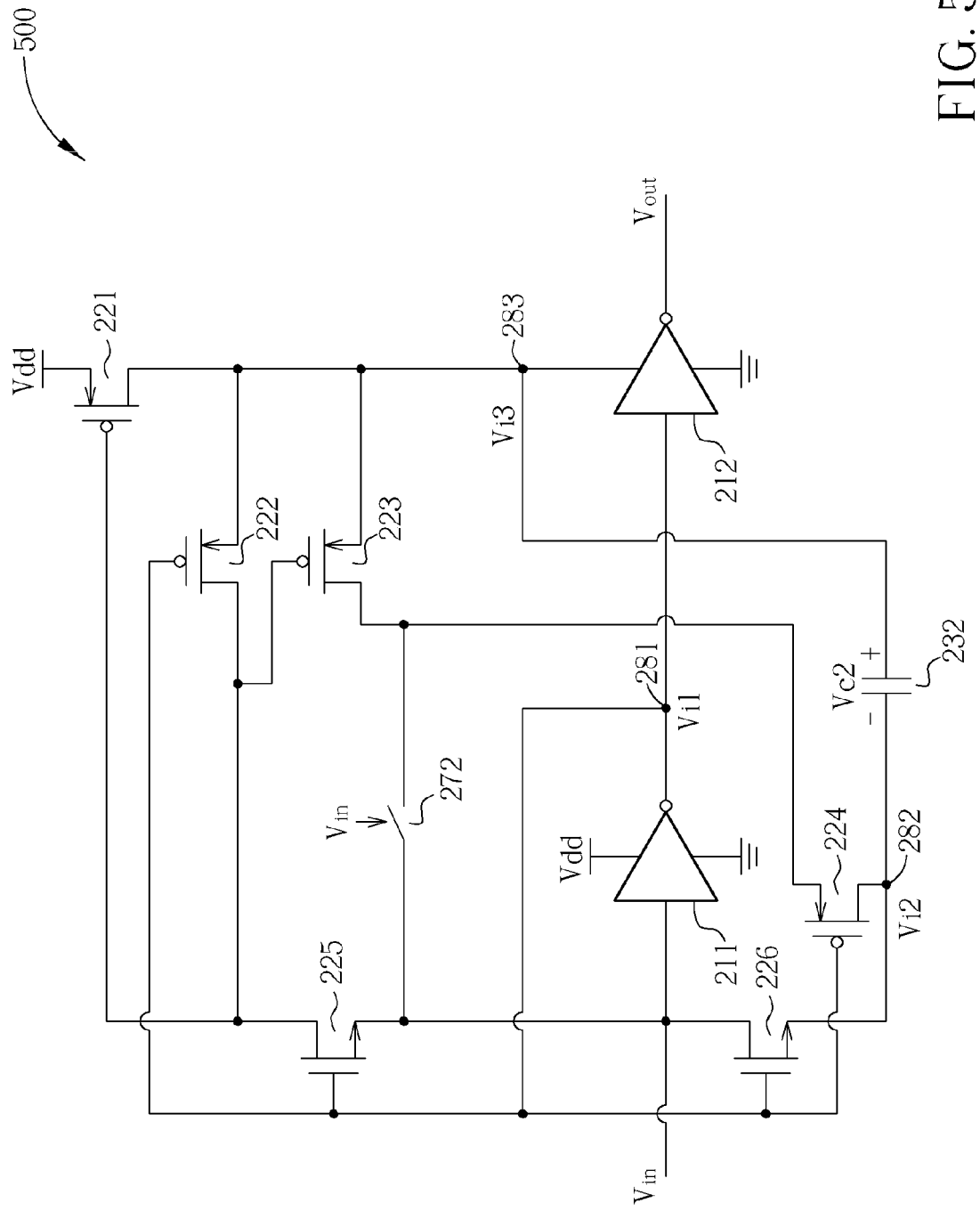
FIG. 5 is a circuit diagram schematically showing a voltage level shifter with voltage boost mechanism in accordance with a fourth embodiment of the present invention.

Please refer to FIG. 5, which is a circuit diagram schematically showing a voltage level shifter with voltage boost mechanism in accordance with a fourth embodiment of the present invention. As shown in FIG. 5, the voltage level shifter 500 comprises a first inverter 211, a second inverter 212, a first transistor 221, a second transistor 222, a third transistor 223, a fourth transistor 224, a fifth transistor 225, a sixth transistor 226, a second capacitor 232, and a switch 272. The switch 272 comprises a first end coupled to the source of the fifth transistor 225, a second end coupled to the drain of the third transistor 223, and a control end for receiving the input voltage Vin. When the input voltage Vin is the ground voltage, the switch 272 is turned off; alternatively, when the input voltage Vin is the voltage Vdd, the switch 272 is turned on.

The structure of the voltage level shifter 500 is similar to the structure of the voltage level shifter 200, differing only in that the first capacitor 231 is replaced with the switch 272. The circuit operation of the voltage level shifter 500 is briefed as the followings.

When the input voltage Vin is the ground voltage, the first transistor 221, the third transistor 223, the fifth transistor 225 and the sixth transistor 226 are turned on, and the second transistor 222, the fourth transistor 224 and the switch 272 are turned off. The second capacitor 232 is charged by the voltage Vdd via the first transistor 221 so that the second capacitor voltage Vc2 can be boosted to the voltage Vdd. Besides, the voltage Vdd is furnished to the power end of the second inverter 212 via the first transistor 221 so that the second inverter 212 is able to perform an inverting operation on the internal voltage Vi1 for outputting the ground voltage as the output voltage Vout.

When the input voltage Vin is the voltage Vdd, the fifth transistor 225 and the sixth transistor 226 are turned off, and the second transistor 222, the fourth transistor 224 and the switch 272 are turned on. The internal voltage Vi3 at the third node 283 becomes a sum voltage 2Vdd of the input voltage Vin and the second capacitor voltage Vc2. The sum voltage 2Vdd is forwarded to the gates of the first transistor 221 and the third transistor 223 via the second transistor 222, and the first transistor 221 and the third transistor 223 are then turned off. Furthermore, the sum voltage 2Vdd is furnished to the power end of the second inverter 212 so that the second inverter 212 is able to perform an inverting operation on the internal voltage Vi1 for outputting the sum voltage 2Vdd as the output voltage Vout.

In summary, the voltage level shifter of the present invention requires only one single supply voltage for performing the level shifting operation on the input voltage. Accordingly, when the voltage level shifter is put in use for interfacing two circuit units having different operating voltage swings, the voltage level shifter is able to perform the voltage level shifting operation based on only the low supply voltage of a front-end circuit unit for generating an output voltage having a high operating voltage swing for driving a back-end circuit unit. In other words, the voltage level shifter is able to work without the aid of a dual voltage generator, and therefore the voltage level shifter can be put into applications effortlessly.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A voltage level shifter, comprising:

a first inverter comprising an input end for receiving an input voltage, an output end, and a power end for receiving a supply voltage;

a second inverter comprising an input end coupled to the output end of the first inverter, an output end for outputting an output voltage, and a power end;

a first transistor comprising a source for receiving the supply voltage, a drain coupled to the power end of the second inverter, and a gate;

a second transistor comprising a source coupled to the drain of the first transistor, a drain coupled to the gate of the first transistor, and a gate coupled to the output end of the first inverter;

a third transistor comprising a source coupled to the drain of the first transistor, a drain, and a gate coupled to the drain of the second transistor;

a fourth transistor comprising a source coupled to the drain of the third transistor, a drain, and a gate coupled to the output end of the first inverter;

a fifth transistor comprising a drain coupled to the gate of the first transistor, a gate coupled to the output end of the first inverter, and a source coupled to the input end of the first inverter;

a sixth transistor comprising a drain coupled to the input end of the first inverter, a gate coupled to the output end of the first inverter, and a source coupled to the drain of the fourth transistor;

a first capacitor comprising a first end coupled to the source of the fifth transistor and a second end coupled to the drain of the third transistor; and a second capacitor comprising a first end coupled to the drain of the fourth transistor and a second end coupled to the drain of the first transistor.

2. The voltage level shifter of claim 1, wherein the first transistor, the second transistor, the third transistor and the fourth transistor are P-type metal oxide semiconductor (MOS) field effect transistors or P-type junction field effect transistors.

3. The voltage level shifter of claim 1, wherein the fifth transistor and the sixth transistor are N-type MOS field effect transistors or N-type junction field effect transistors.

4. The voltage level shifter of claim 1, further comprising:

a third capacitor comprising a first end coupled to the second end of the first capacitor and a second end coupled to the drain of the third transistor.

5. The voltage level shifter of claim 4, further comprising:

a buffer comprising an input end coupled to the second end of the first capacitor and an output end coupled to the source of the fourth transistor.

* * * * *